(12) United States Patent
Colbert et al.

(10) Patent No.: US 8,446,738 B2
(45) Date of Patent: May 21, 2013

(54) MOTHERBOARD ASSEMBLY FOR INTERCONNECTING AND DISTRIBUTING SIGNALS AND POWER

(75) Inventors: John L. Colbert, Byron, MN (US); Arvind K. Sinha, Rochester, MN (US); Roger D. Weekly, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 12/579,051

(22) Filed: Oct. 14, 2009

(65) Prior Publication Data
US 2011/0085313 A1 Apr. 14, 2011

(51) Int. Cl.
*H05K 1/11* (2006.01)
*H05K 1/14* (2006.01)

(52) U.S. Cl.
USPC ........... 361/803; 361/784; 361/792; 174/250; 174/255

(58) Field of Classification Search
USPC .................. 361/803, 784, 792, 764; 174/250, 174/255
See application file for complete search history.

(56) References Cited

U.S. PATENT DOCUMENTS

| | | | |
|---|---|---|---|
| 5,935,687 A | 8/1999 | Davidson et al. | |
| 6,241,531 B1 | 6/2001 | Roath et al. | |
| 6,354,844 B1 | 3/2002 | Coico et al. | |
| 6,435,883 B1 | 8/2002 | Warren | |
| 6,477,058 B1 * | 11/2002 | Luebs et al. | 361/784 |
| 6,540,525 B1 | 4/2003 | Li et al. | |
| 6,590,159 B2 | 7/2003 | Fan et al. | |
| 6,903,941 B2 | 6/2005 | Paola | |
| 6,992,373 B2 | 1/2006 | Zheng | |
| 7,160,119 B2 | 1/2007 | Rathburn | |
| 7,227,248 B2 | 6/2007 | Zheng | |
| 7,284,992 B2 | 10/2007 | Becker et al. | |
| 7,361,026 B2 | 4/2008 | Hougham et al. | |

(Continued)

OTHER PUBLICATIONS

USPTO U.S. Appl. No. 11/938,858, 2 pages.

(Continued)

*Primary Examiner* — Yuriy Semenenko
*Assistant Examiner* — Andargie M Aychillhum
(74) *Attorney, Agent, or Firm* — Stephen J. Walder, Jr.; Diana R. Gerhardt

(57) ABSTRACT

A system, method, and motherboard assembly are described for interconnecting and distributing signals and power between co-planar boards that function as a single motherboard. The motherboard assembly includes a multilayered first printed circuit board having opposed parallel first and second surfaces, each having at least one land grid array (LGA) disposed thereon. The assembly further includes at least one wiring layer (Y) designed to only electrically interconnect components on or within the first PCB, and at least one wiring layer (X) designed to only electrically connect the components on the first PCB to a multilayered second PCB. The multilayered second PCB has opposed parallel first and second surfaces, the first surface having at least one LGA disposed thereon. It further includes at least one wiring layer (V) designed to only electrically interconnect components on or within the second PCB, and at least one layer (X) designed to only electrically interconnect the components on the second PCB with the components on the first PCB. A first LGA interposer couples to the LGA disposed on the first surface of the first PCB, and electrically connects at least one component to the first PCB. A second LGA interposer is sandwiched between and couples to the LGA disposed on the second surface of the first PCB and to the LGA disposed on the first surface of the second PCB. It electrically connects the first PCB to components on the second PCB.

14 Claims, 6 Drawing Sheets

U.S. PATENT DOCUMENTS

| | | |
|---|---|---|
| 7,374,428 B2 | 5/2008 | Hougham et al. |
| 7,438,557 B1 | 10/2008 | Plucinski et al. |
| 7,473,102 B2 * | 1/2009 | Colgan et al. ............ 439/66 |
| 7,534,111 B1 | 5/2009 | Plucinski et al. |
| 2007/0232090 A1 | 10/2007 | Colgan et al. |
| 2008/0233771 A1 | 9/2008 | Colbert et al. |
| 2008/0235942 A1 | 10/2008 | Hougham et al. |
| 2008/0239683 A1 | 10/2008 | Brodsky et al. |

OTHER PUBLICATIONS

USPTO U.S. Appl. No. 12/175,071, 1 page.
Tsuda, Kenji, "Interposers Play a Key Role in 3-D ICs", Semiconductor International, Oct. 15, 2008, 2 pages.
USPTO U.S. Appl. No. 13/611,609, 1 page.

* cited by examiner

MOTHERBOARD ASSEMBLY FOR INTERCONNECTING AND DISTRIBUTING SIGNALS AND POWER

BACKGROUND

1. Technical Field

The present invention relates to printed circuit boards used in large computing systems, and in particular to a motherboard assembly having stacked land grid array (LGA) connectors for interconnecting and distributing signals and power therein.

2. Description of the Related Art

The electronics industry widely uses electrical connectors. In many computers and other electronic circuit structures, an electronic module or chip, such as a central processor unit (CPU), memory module, application-specific integrated circuit, or other integrated circuits having a module substrate, connects to a printed wiring board using an electronic connector. Printed wiring boards are also known as printed circuit boards (PCBs) and etched wiring boards. A printed circuit board is commonly referred to as a printed circuit board assembly (PCBA) when it is populated with one or more electronic modules. When a PCBA is used as the central PCB in a complex electronic system, it is commonly referred to as a motherboard. To connect an electronic module to a PCB or motherboard, a plurality of individual electrical contacts on the base of the electronic module must connect to a plurality of corresponding individual electrical contacts on the PCB/motherboard.

When an LGA connector connects the electronic module to the PCB, this set of contacts is known as land grid arrays (LGAs). A LGA is a type of surface-mount packaging where there are no pins on the module. Rather, in place of pins are pads of gold-plated copper, for example, that couple to pads on the PCB (e.g., motherboard). Rather than permanently soldering the electronic module contacts to the LGA site, it is desirable to use LGA connectors that allow the user to install and remove the electronic module to/from the LGA site. LGA connectors provide the user with the flexibility to upgrade or replace electronic modules during the manufacturing cycle and in the field. LGA connectors are also known in the art as sockets, interconnects, interposers, carriers, and button board assemblies. In general, LGA connectors provide electrical connections between two parallel electrical substrates in computing equipment through the use of an interposer. Typically, one of these substrates is a PCB (e.g., motherboard) and the other is an electronic module, which may, for example, have either a ceramic or organic laminate substrate.

PCBs typically include multiple conductive layers laminated with insulating plastic there between. The conductive layers are typically reserved for power, power return, ground, and signals. The layers reserved for signals contain etchings to form "traces" that conduct the signals. The layers reserved for power, power return and ground are typically referred to as "power planes", "power return planes", and "ground planes". The conductive layers connect together by drilling holes called vias and then plating each via with a conductor to form a plated-through-hole (PTH).

In large symmetric multiprocessing (SMP) computer systems, it is advantageous to package as much of the system as possible within a single rack drawer. To maximize component density as a function of printed circuit board density, it is desirable to package an entire system on a single printed circuit motherboard. FIG. 1 is a top perspective view of motherboard 100 having many modules, including high power modules 102, such as CPUs, associated memory modules 104, as well as "concentrator" modules 108 such as hubs 1-8. Unfortunately, the ability to manufacture a large enough motherboard that is capable of placing all such modules shown on motherboard 100 is limited by the existing standard tooling available by printed circuit board manufacturers. Generally, the larger the PCB, the smaller the yield because there are more risk sits on the PCB. At some point, the cost to manufacture a PBC of a certain size or larger becomes prohibitive. For example, a vendor with large panel capability can manufacture PCBs with active areas up to a dimension of 30.35" by 22.87", but no larger. Because motherboard 100 requires a dimension larger than this, PBC vendors are not tooled to manufacture motherboard 100. It is simply too large.

Alternatively, to generate an assembly having a large enough surface area, but which can be manufactured using standing tooling, motherboard 100 may be divided into two coplanar printed circuit boards and connected using a connector, such as a right angle-to-right angle or coplanar connector. Coplanar PBCs mean two or more boards lying in the same plane. FIG. 2 is a top view perspective of an illustrative conventional PCBA 200 having high power modules 202 positioned on PCB 204, and concentrator modules 208 positioned on PCB 210. Right angle interconnect 206 connects coplanar PCBs 204 and 210 such that they function as a single motherboard. Because PCBs 204 and 210 are each much smaller in terms of X,Y dimension than motherboard 100, they may be manufactured using standard large panel tooling. Unfortunately, however, the system drawer (not shown) housing PCBA 200 must grow to accommodate the width of right angle interconnect 206 as an addition to the card surface area. Moreover, the use of interconnect 206 may degrade signal integrity because signals traveling between PCBs 204 and 206 must pass through it.

It should therefore be apparent that a need exists for an enhanced mechanism for interconnecting and distributing signals and power between coplanar boards in large systems that consume minimal additional surface area.

SUMMARY

A computing system, method, and motherboard assembly are described for interconnecting and distributing signals and power between co-planar boards that function as a single motherboard. The motherboard assembly includes a multi-layered first printed circuit board having opposed parallel first and second surfaces, each having at least one land grid array (LGA) disposed thereon. The assembly further includes at least two wiring layers (Y and Z) designed to only electrically interconnect components on or within the first PCB, and at least two wiring layers (X and W) designed to only electrically connect the components on the first PCB to a multilayered second PCB. The multilayered second PCB has opposed parallel first and second surfaces, the first surface having at least one LGA disposed thereon. It further includes at least one wiring layer (V) designed to only electrically interconnect components on or within the second PCB, and at least two layers (X and W) designed to only electrically interconnect the components on the second PCB with the components on the first PCB. A first LGA interposer couples to the LGA disposed on the first surface of the first PCB, and electrically connects at least one component to the first PCB. A second LGA interposer is sandwiched between and couples to the LGA disposed on the second surface of the first PCB and to the LGA disposed on the first surface of the second PCB. It electrically connects the first PCB to components on the second PCB, such that the first and second PCB function as a single motherboard. The first and second LGA interposers route only signals on the X and W wiring layers between the first and second PCBs.

DETAILED DESCRIPTION

Figure 1:
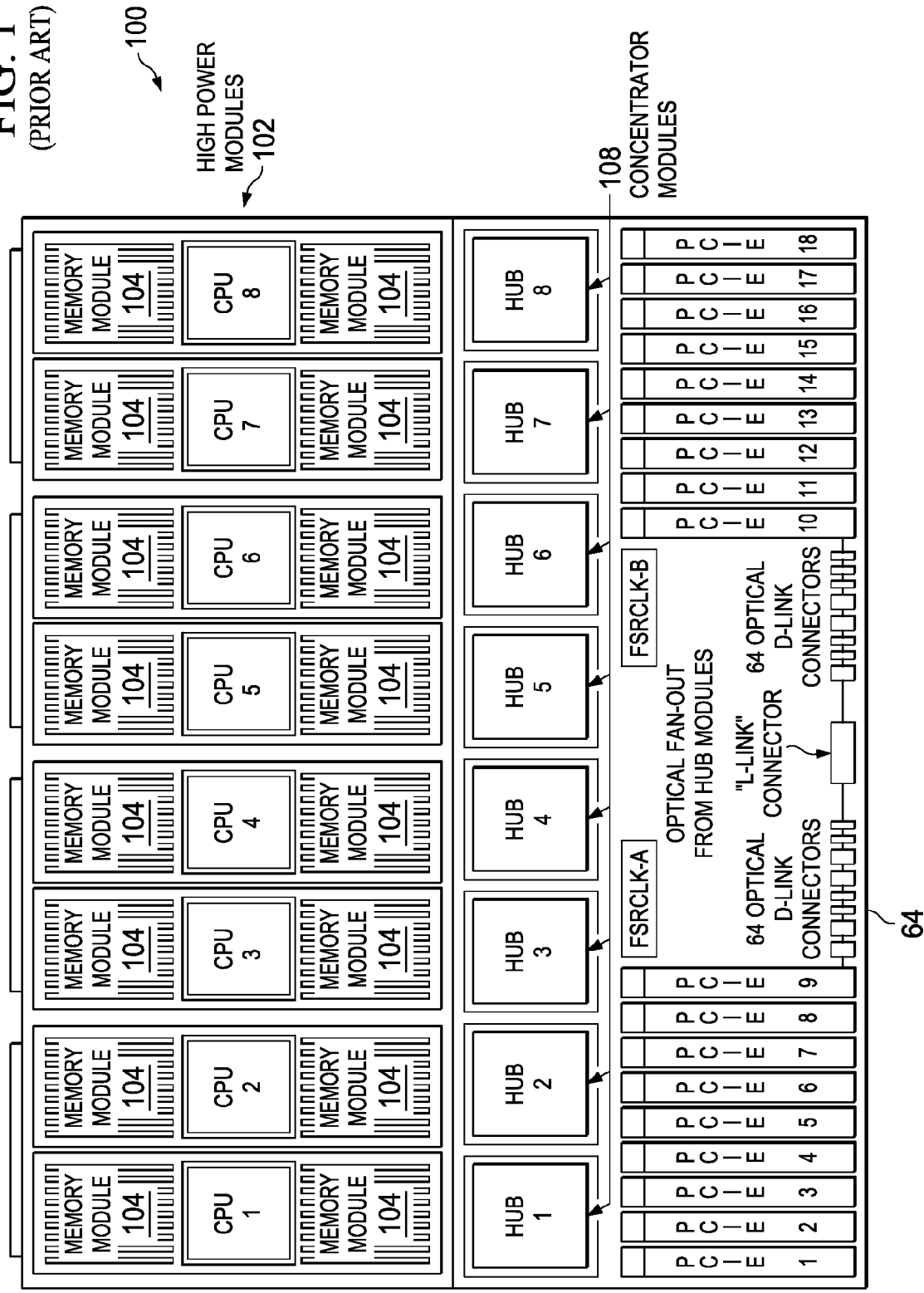
FIG. 1 is a top view perspective of a conventional motherboard 100 having many modules disposed thereon.
Figure 2:
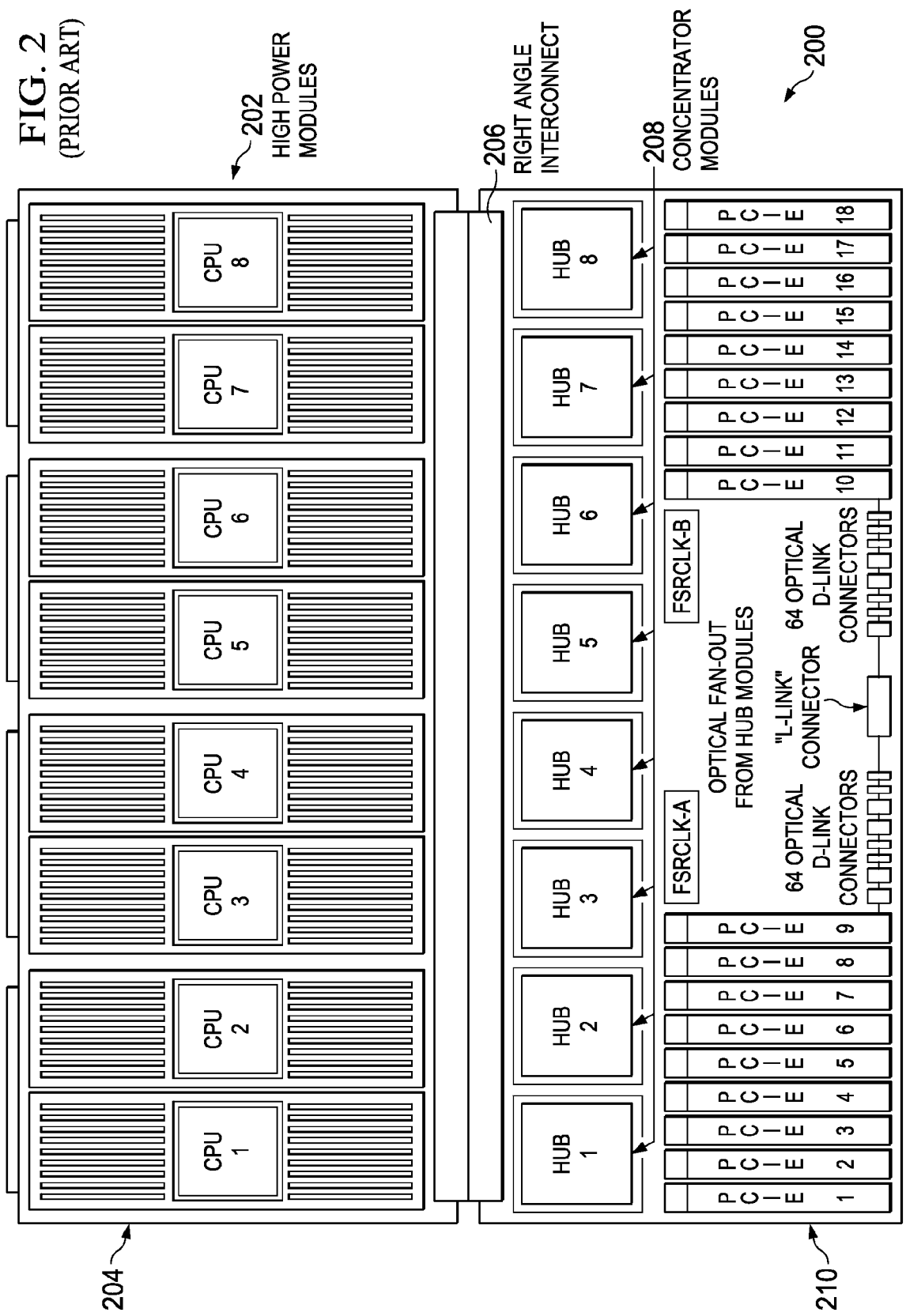
FIG. 2 is a top view perspective of a conventional PCBA having two PCBs connected using a right angle interconnect.
Figure 3:
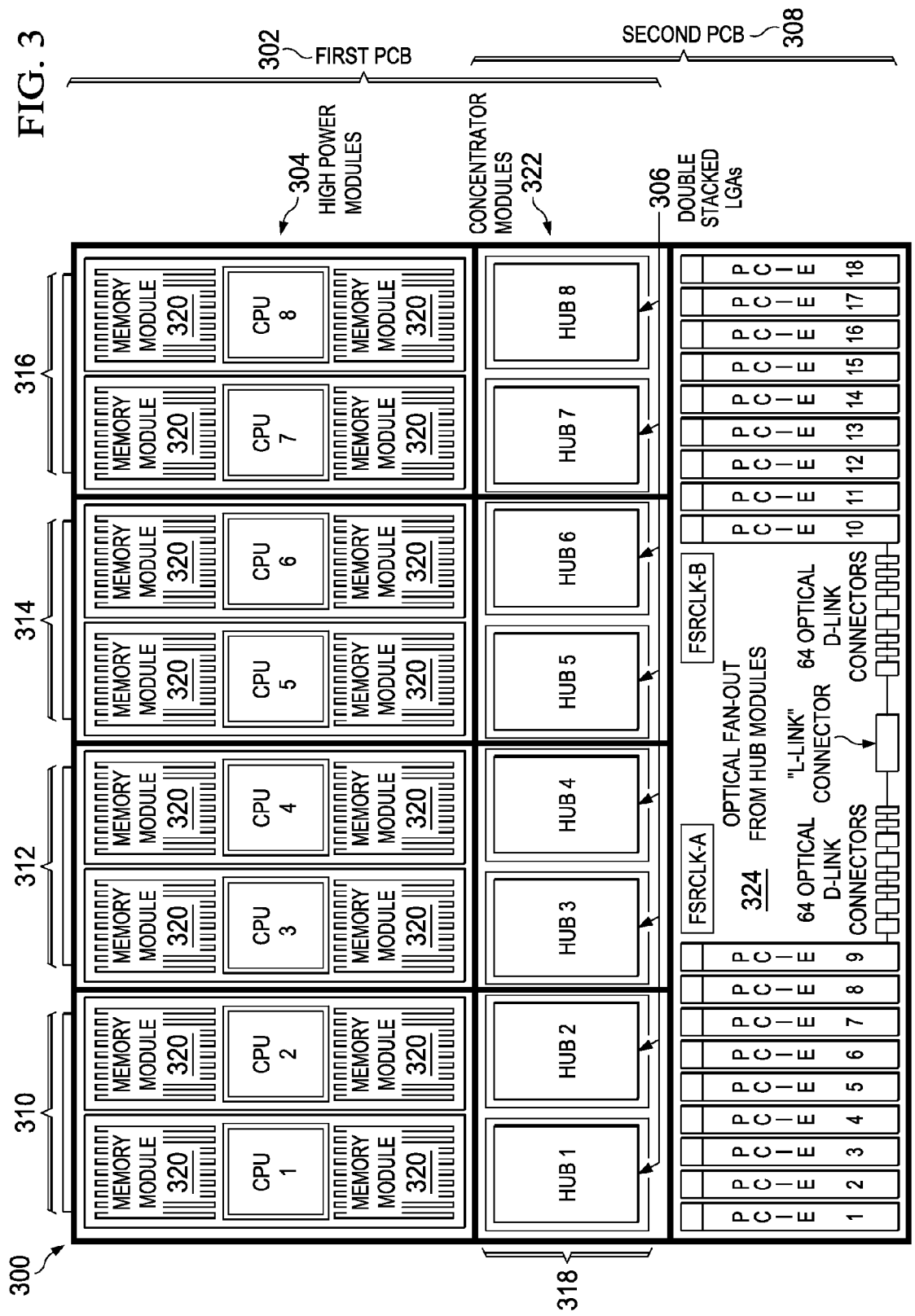
FIG. 3 illustrates a top view perspective of a motherboard assembly having two co-planar PCBs electrically connected using double stacked LGAs according to an embodiment of the present invention.

In accordance with the preferred embodiments of the present invention, a computer system and motherboard assembly are described for interconnecting and distributing signals and power between co-planar boards that function as a single motherboard. FIG. 3 illustrates a top view perspective of motherboard assembly 300, which may be used in a computing system, comprising two co-planar PCBs 302 and 308 electrically interconnected using double stacked LGAs 306. In one embodiment, PCB 302, which in this embodiment is the "bottom" board, has multiple LGAs on its "top" surface to facilitate electrical communication with high power modules 304 (such as central processing units ("CPUs") 1 through 8) and associated memory modules 320, and also in region 318 to facilitate communication with PCB 308. In a second embodiment, PCB 302 is alternatively divided into four separate co-planar PCBs 310, 312, 314, and 316. CPUs 1-2, a portion of associated memory modules 320, and two LGAs 306 position on the top surface of PCB 310, CPUs 3-4, a portion of associated memory modules 320, and two LGAs 306 position on the top surface of PCB 312, and so on. One skilled in the art will recognize that other combinations of PCBs could be used as well.

PCB 308, which in this embodiment is the "top" board, positions various other modules thereon, such as hubs 1-8, and includes functionality such as PCI Express interconnects 1-18 and other links 324. Other or different modules and functionality—collectively referred to as "components"—may be positioned/incorporated on PCB 308 as well. PCB 308 is referred to as the "top" board because it overlaps PCB 302 (or alternatively PCBs 310-316) at region 318, which is the location of a plurality of double stacked LGAs 306. Double stacked LGAs 306 electrically interconnect signals and power between PCBs 302 and 308, such that they function as a single motherboard. In region 318, PCB 308 has LGAs disposed on its "top" surface to electrically interconnect with concentrator modules 322 (e.g., hubs 1-8), and LGAs disposed on its "bottom" surface (which is parallel to the "top" surface) to electrically interconnect with PCB 302. As such, the board-to-module interconnect area overlaps the board-to-board interconnect area in region 318. For large SMP computing systems, the density of placed components can be maximized without requiring the development of a printed circuit motherboard beyond the tooled capabilities of printed circuit board vendors.

Figure 4:
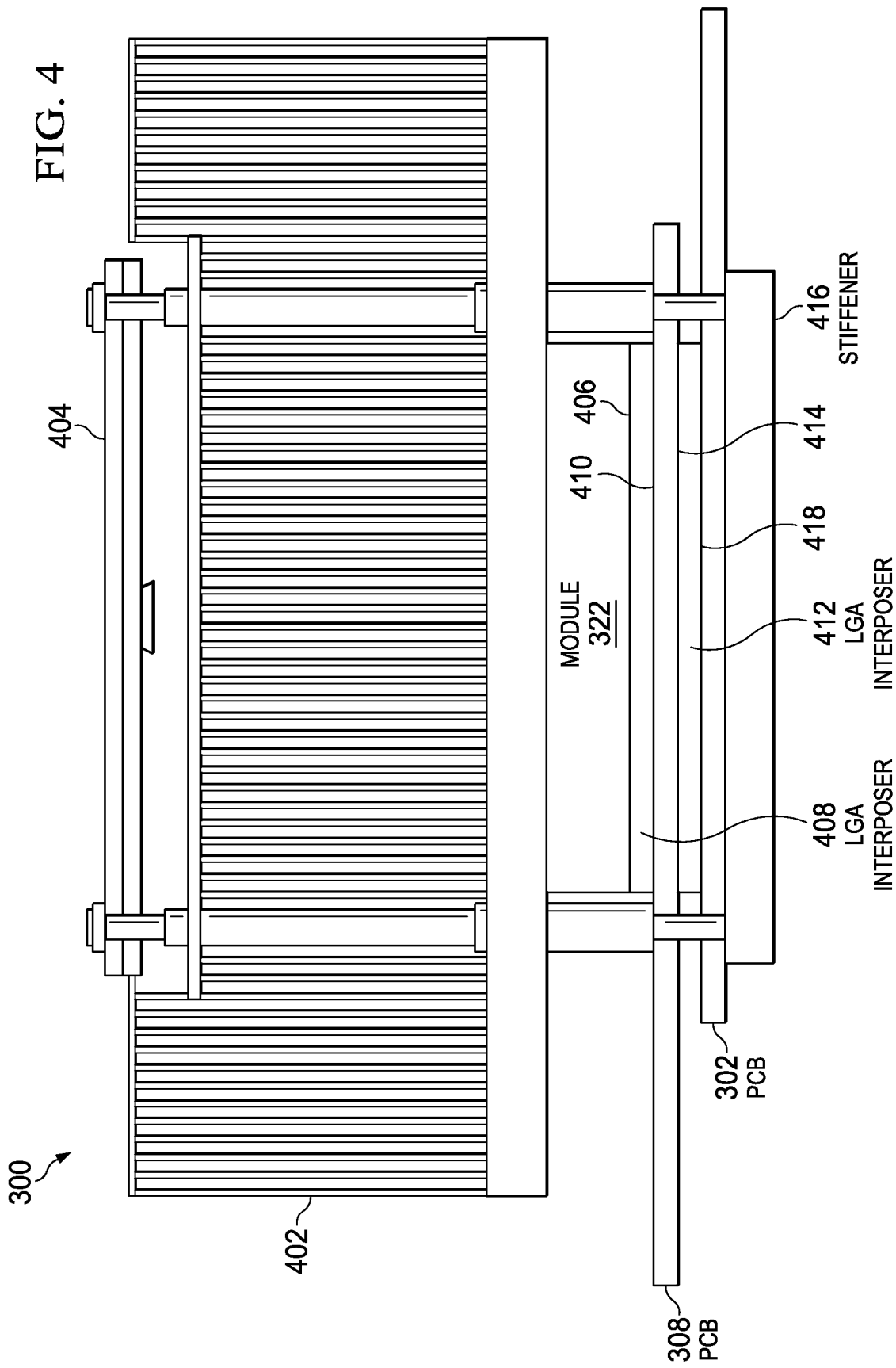
FIG. 4 illustrates a cross sectional view of the motherboard assembly shown in FIG. 3 at the LGA sites.

FIG. 4 illustrates a cross sectional view of motherboard assembly 300 in a portion of region 318, which contains double stacked LGAs 306. For ease in explanation, only one concentrator module 322 is shown. Motherboard assembly 300 includes heat sink 402 (not shown in FIG. 3) for providing heat transfer functions, pressure plate 404 (not shown in FIG. 3) for applying compression to the stacked components, concentrator module 322 (which illustratively may be one of hubs 1-8 shown in FIG. 3), LGA interposers 408 and 412, PCBs 302 and 308, and stiffener 416.

Concentrator module 322 has electrically conductive LGA pads (not shown) disposed on its bottom surface, at 406, for electrically connecting to PCB 308 via LGA interposer 408. To do so, LGA interposer 408 also has: i) electrically conductive pads disposed on its top surface, at 406, for coupling (mating) to the conductive pads of module 322, and ii) a bottom surface, parallel to its top surface, having conductive pads, at 410, for coupling to an LGA 306 disposed on the top surface of PCB 308. The electrically conductive pads disposed on the top and bottom surfaces of LGA interposer 408 connect via copper contacts (not shown) disposed within LGA interposer 408. Typically, an LGA interposer, such as LGA interposers 408 and 412, is a molded insulator or thin polymer insulator. A plurality of LGA contacts are press-fit into holes drilled in the molded or thin polymer insulator. These LGA contacts may be, for example, of a press-fit design, surface mount design, and/or friction fit design (e.g., waded wire buttons or molded metal filled elastomer contacts).

As previously described, PCB 308 is the "top" board, and has gold plated conductive LGA pads disposed on both its top surface at 410 and parallel opposing bottom surface at 414 (described in more detail in FIG. 6) for coupling (mating) with LGA pads on LGA interposers 408 and 412, respectively. PCB 302 is the "bottom" board and also has gold plated conductive LGA pads on its top surface, at 418, to electrically couple with LGA pads on the bottom surface of LGA interposer 412. Accordingly, LGA interposer 412 is sandwiched between PCB 308 and PCB 302 to electrically interconnect them. Further, PCB 308 is sandwiched between module 322 and PCB 302, with LGA interposers 408 and 412 providing the respective connectivity. The average static forces through LGA interposers 408 and 412 are substantially the same and are set by conventional load screw and springs (not shown). The flatness of each PCB 308 and 302 divides between LGA interposers 408 and 412 such that the contact load distribution is no worse than expected with a conventional single LGA. Stiffener 416 positions to the bottom surface of PCB 302 to provide rigidity support, and is preferably a metal or steel plate.

Figure 5:
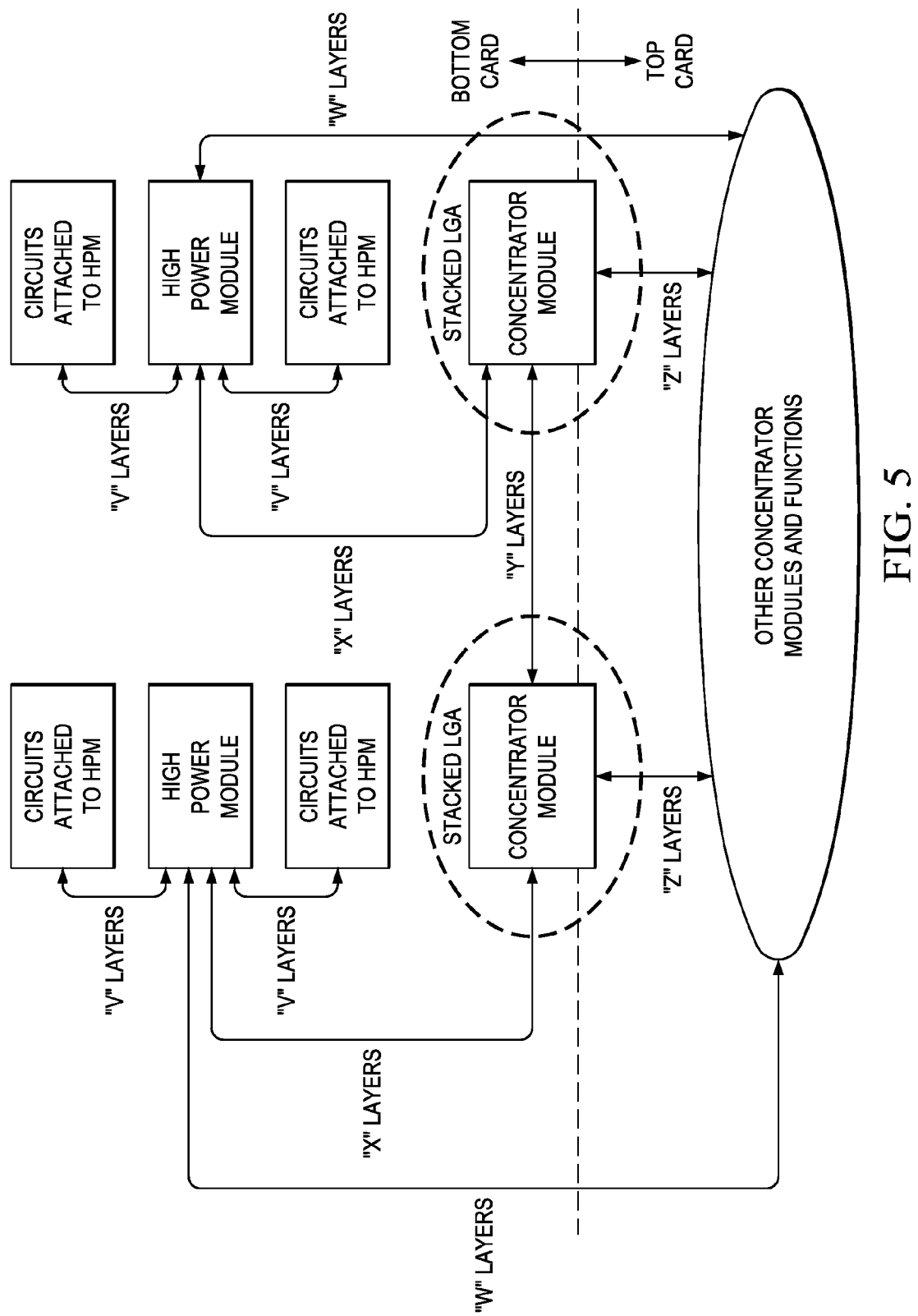
FIG. 5 illustrates the wiring required to interconnect modules of motherboard assembly 300.

The wiring layers in PCBs 302 and 308 required to interconnect the various component impact the thickness of PCBs 302 and 308. FIG. 5 illustrates the wiring layers required to interconnect components of motherboard assembly 300. Referring to FIGS. 3 and 5, the wiring layers for transmitting signals between concentrator modules 322 are denoted by 'Y' layers, and between concentrator modules 322 and other concentrator modules and functionality (collectively referred to as components) 324 are denoted by 'Z' layers, both of which reside only in the top board (i.e., PCB 308). Accordingly, because layers Y and Z are not included in the bottom board (i.e., PCB 302), signals on those layers are not routed through double stacked LGAs 306. Similarly, the wiring layers required to connect high power modules 304 to other components (e.g., memory modules 320) positioned on the bottom board (i.e., PCB 302) are denoted as 'V' layers, which also need not be routed through double stacked LGAs 306 because V layers are not included in the top board (i.e., PCB 308). The wiring layers required to transmit signals between high power modules 304 on the bottom board (i.e., PCB 302) and: i) the concentrator modules (e.g., hubs 1-8) on the top board (i.e., PCB 308) are denoted by 'X' layers; and ii) other concentrator modules and functionality 324 on the top board (i.e., PCB 308) are denoted by 'W' layers. Signals on layers X and W are transmitted between PCBs 302 and 308 using the double stacked LGAs 306.

As can be seen, the number of layers in the bottom board (i.e., PCB 302) and top board (PCB 308) may be reduced, while a conventional single motherboard used in this manner would require more layers. The yield of those smaller boards will be improved due to the significant reduction in risk sites compared with a single printed circuit board.

Figure 6:
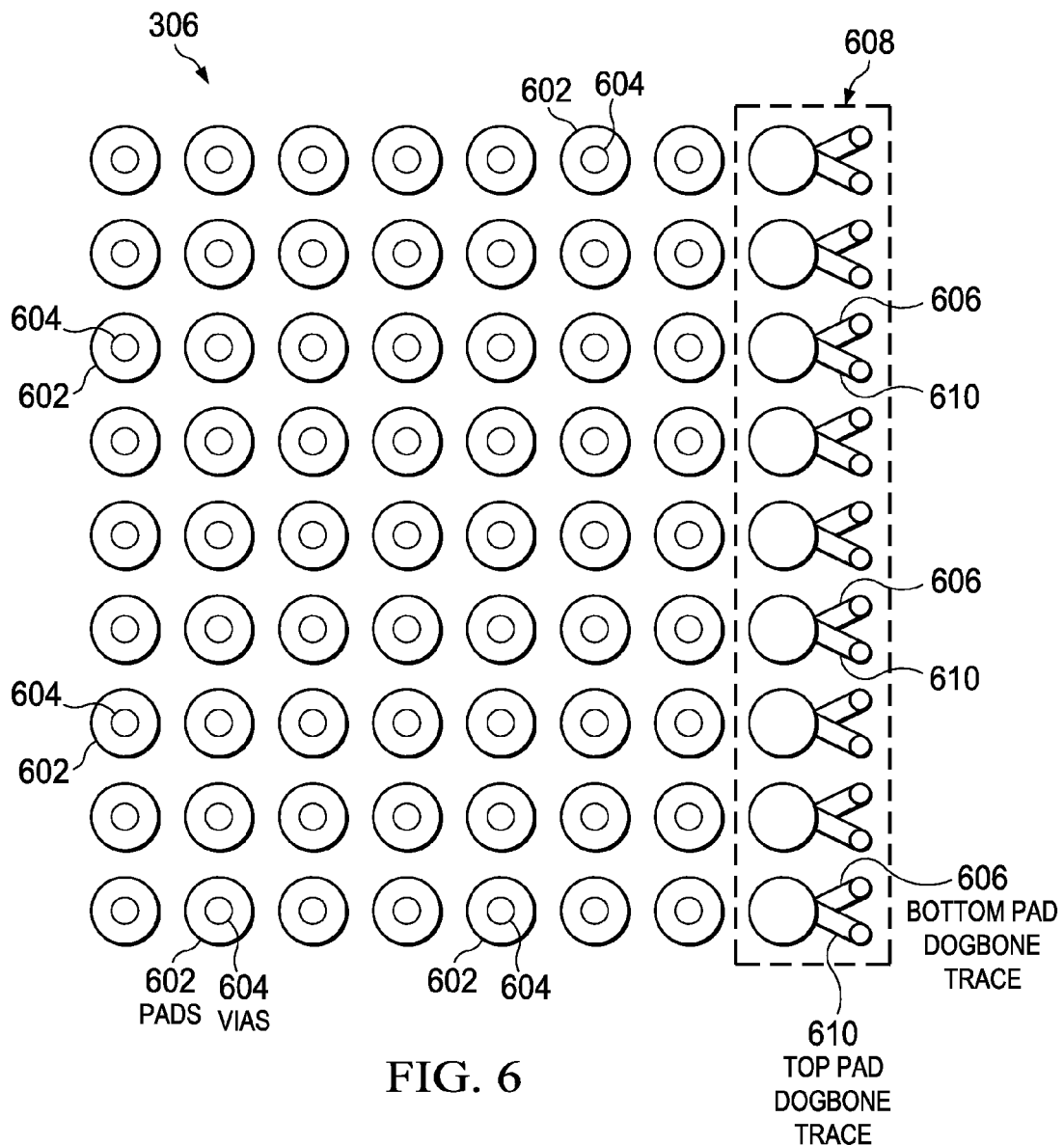
FIG. 6 illustrates a top view perspective of vias and pads used in a PBC according to an embodiment of the present invention.

FIG. 6 illustrates a top view perspective of the top surface of PCB 308 at region 318 in FIG. 3, which shows a representative LGA 306 disposed on PCB 308. This view also illustrates the opposing LGA 306 on the bottom surface of PCB 308 at region 318, which is parallel and opposed to the top surface. LGA 306 includes a plurality of electrically conductive pads 602 having, with the exception of pads 608, holes or vias 604 drilled into PCB 308 to electrically connect top and bottom opposed pads 602 together at each x, y location. This allows module 322, for example, to electrically connect to PCB 302 through pairs of pads 602 disposed on both surfaces of PCB 308. On the other hand, at each pad 608 on the top surface of PCB 308, a "dogbone" trace may be made from such top pad to via 606. Similarly, at each pad 608 on the corresponding opposed bottom surface of PCB 308, another "dogbone" trace may be made from such bottom pad to via 610. Vias 606 and 610 do not overlap and may terminate at different layers within PCB 308, such that opposed top and bottom pad pairs 606 do not electrically connect through PCB 308. This enables module 322, for example, to electrically interconnect to a particular layer within PCB 308 at a particular upper pad 606, while at the opposed bottom pad 606, PCB 302 may electrically interconnect to a different layer within PCB 308.

In summary, the present embodiment interconnects components via two coplanar PCBs, functioning as a single motherboard, using double stacked LGA interposers. One skilled in the art will appreciate that many variations are possible within the scope of the present embodiment. Thus, while the present invention has been particularly shown and described with reference to the preferred embodiments thereof, it will be understood by those skilled in the art that these and other changes in form and detail may be made therein without departing from the spirit and scope of the present invention.

What is claimed:

1. A motherboard assembly, comprising;
    a multilayered first printed circuit board (PCB) having opposed parallel first and second surfaces, each having at least one land grid array (LGA) disposed thereon, and further having at least one wiring layer (Y) designed to only electrically interconnect components on or within the first PCB, and at least one wiring layer (X) designed to only electrically connect the components on the first PCB to a multilayered second PCB;
    the multilayered second PCB having opposed parallel first and second surfaces, the first surface having at least one LGA disposed thereon, and further having at least one wiring layer (V) designed to only electrically interconnect components on or within the second PCB, and at least one layer (X) designed to only electrically interconnect the components on the second PCB with the components on the first PCB;
    a first LGA interposer coupled to the LGA disposed on the first surface of the first PCB for electrically connecting at least one component to the first PCB; and
    a second LGA interposer sandwiched between and coupling to the LGA disposed on the second surface of the first PCB and to the LGA disposed on the first surface of the second PCB for electrically connecting the first PCB to components on the second PCB, wherein the at least one component comprises a plurality of concentrator modules, and wherein wiring layers for connecting the plurality of concentrator modules to each other are present only within the multilayered first PCB and are not included in the multilayered second PCB, and wherein signals on the wiring layers connecting the plurality of concentrator modules to each other are not routed through the first LGA interposer and the second LGA interposer.

2. The assembly of claim 1, further comprising:
    the first PCB further having a second wiring layer (Z) designed to only electrically interconnect components on or within the first PCB, and a second wiring layer (W) designed to only electrically connect the components on the first PCB to the second PCB; and
    the second PCB further having a second wiring layer (W) designed to only electrically interconnect the components on the second PCB with the components on the first PCB.

3. The assembly of claim 2, further comprising:
    the first and second LGA interposers for routing only signals on the X and W wiring layers between the first and second PCBs.

4. The assembly of claim 1, wherein the first and second PCBs are coplanar and function as a single motherboard.

5. The assembly of claim 1, wherein the LGAs disposed on the first and second opposing surfaces of the first PCB comprise:
    a plurality of parallel, opposing conductive pads disposed on the first and second opposing surfaces of the first PCB;
    a plurality of vias positioned in a first portion of the opposing conductive pads for electrically connecting the opposing conductive pads on the first and second surfaces of the first PCB; and
    a dogbone trace connecting each of a second portion of opposing conductive pads to a respective via not positioned in the conductive pad, such that the second portion of opposing conductive pads on the first and second surfaces of the first PCB are not electrically connected.

6. The assembly of claim 1, wherein the second LGA interposer connects both signals and power of the multilayered first PCB and multilayered second PCB so that together the multilayered first PCB and multilayered second PCB operate as a single motherboard.

7. The assembly of claim 1, wherein the at least one component comprises at least one hub.

8. A computing system, comprising;
    at least one processing unit (CPU) and memory coupled thereto;
    a multilayered first printed circuit board (PCB) having opposed parallel first and second surfaces, each having at least one land grid array (LGA) disposed thereon, and further having at least one wiring layer (Y) designed to only electrically interconnect the CPU and memory on the first PCB, and at least one wiring layer (X) designed to only electrically connect the CPU and memory on the first PCB to a multilayered second PCB;

the multilayered second PCB having opposed parallel first and second surfaces, the first surface having at least one LGA disposed thereon, and further having at least one wiring layer (V) designed to only electrically interconnect components on or within the second PCB, and at least one layer (X) designed to only electrically interconnect the components on the second PCB with the CPU and memory on the first PCB;

a first LGA interposer coupled to the LGA disposed on the first surface of the first PCB for electrically connecting the CPU and memory to the first PCB; and a second LGA interposer sandwiched between and coupling to the LGA disposed on the second surface of the first PCB and to the LGA disposed on the first surface of the second PCB for electrically connecting the first PCB to components on the second PCB, wherein the first PCB comprises a plurality of concentrator modules, and wherein wiring layers for connecting the plurality of concentrator modules to each other are present only within the multilayered first PCB and are not included in the multilayered second PCB, and wherein signals on the wiring layers connecting the plurality of concentrator modules to each other are not routed through the first LGA interposer and the second LGA interposer.

9. The system of claim 8, further comprising:

the first PCB further having a second wiring layer (Z) designed to only electrically interconnect the CPU and memory on the first PCB, and a second wiring layer (W) designed to only electrically connect the CPU and memory on the first PCB to the second PCB; and the second PCB further having a second wiring layer (W) designed to only electrically interconnect the components on the second PCB with the CPU and memory on the first PCB.

10. The system of claim 9, further comprising:

the first and second LGA interposers for routing only signals on the X and W wiring layers between the first and second PCBs.

11. The system of claim 8, wherein the first and second PCBs are coplanar and function as a single motherboard.

12. The system of claim 8, wherein the LGAs disposed on the first and second opposing surfaces of the first PCB comprise:

a plurality of parallel, opposing conductive pads disposed on the first and second opposing surfaces of the first PCB;

a plurality of vias positioned in a first portion of the opposing conductive pads for electrically connecting the opposing conductive pads on the first and second surfaces of the first PCB; and a dogbone trace connecting each of a second portion of opposing conductive pads to a respective via not positioned in the conductive pad, such that the second portion of opposing conductive pads on the first and second surfaces of the first PCB are not electrically connected.

13. The system of claim 8, wherein the second LGA interposer connects both signals and power of the multilayered first PCB and multilayered second PCB so that together the multilayered first PCB and multilayered second PCB operate as a single motherboard.

14. The system of claim 8, wherein the at least one component comprises at least one hub.

* * * * *